United States Patent
Pulikanti et al.

(10) Patent No.: US 12,095,272 B2
(45) Date of Patent: Sep. 17, 2024

(54) METHOD AND APPARATUS OF DETECTING GRID ISLANDING

(71) Applicant: ABB Schweiz AG, Baden (CH)

(72) Inventors: Sridhar Pulikanti, Napier (NZ); Simon Walton, Napier (NZ); Robert Turner, Hastings (NZ); Nicholas James Elliott, Hastings (NZ)

(73) Assignee: ABB SCHWEIZ AG, Baden (CH)

( * ) Notice: Subject to any disclaimer, the term of this patent is extended or adjusted under 35 U.S.C. 154(b) by 30 days.

(21) Appl. No.: 17/757,581

(22) PCT Filed: Dec. 27, 2019

(86) PCT No.: PCT/EP2019/087105
§ 371 (c)(1),
(2) Date: Jun. 17, 2022

(87) PCT Pub. No.: WO2021/129944
PCT Pub. Date: Jul. 1, 2021

(65) Prior Publication Data
US 2023/0018100 A1    Jan. 19, 2023

(51) Int. Cl.
*H02J 3/38* (2006.01)
*H02J 9/06* (2006.01)

(52) U.S. Cl.
CPC .......... *H02J 3/388* (2020.01); *H02J 9/06* (2013.01)

(58) Field of Classification Search
CPC ...................................................... H02J 3/388
USPC ............................................................ 307/23
See application file for complete search history.

(56) References Cited

U.S. PATENT DOCUMENTS

| 7,138,728 | B2 | 11/2006 | Lerow et al. | |
| 2002/0039299 | A1 | 4/2002 | Nishimura et al. | |
| 2014/0300187 | A1* | 10/2014 | Kojima | H02J 3/381 |
| | | | | 307/24 |
| 2016/0118847 | A1 | 4/2016 | Colombi | |
| 2017/0112683 | A1 | 4/2017 | Fukasawa | |
| 2018/0348288 | A1* | 12/2018 | Zhang | G01R 31/086 |

(Continued)

FOREIGN PATENT DOCUMENTS

| EP | 2899836 A1 * | 7/2015 | ............... H02J 3/01 |
| JP | H06343230 A | 12/1994 | |

(Continued)

OTHER PUBLICATIONS

International Search Report and Written Opinion, issued by the ISA/EP European Patent Office, regarding corresponding patent application Serial No. PCT/EP2019/087105; dated Feb. 27, 2020; 16 pages.

(Continued)

*Primary Examiner* — Daniel Kessie
*Assistant Examiner* — Dru M Parries
(74) *Attorney, Agent, or Firm* — Greenberg Traurig, LLP (57) ABSTRACT

Embodiments of the present disclosure relate to method and apparatus for detecting grid islanding in a grid supporting voltage source converter. The method includes modulating an output voltage at an output of the grid supporting voltage source converter; determining at least one grid parameter at an input to the grid supporting voltage source converter; and detecting the grid islanding for the grid supporting voltage source converter based on the at least one grid parameter.

20 Claims, 6 Drawing Sheets

(56) References Cited

U.S. PATENT DOCUMENTS

2019/0229535 A1* 7/2019 Pmsvvsv .................. H02J 9/06
2021/0194356 A1* 6/2021 Afridi ..................... H02J 9/062

FOREIGN PATENT DOCUMENTS

| JP | 2000308264 A | 11/2000 |
| JP | 2001258161 A | 9/2001 |
| JP | 2017112683 A | 6/2017 |
| JP | 2017121149 A | 7/2017 |

OTHER PUBLICATIONS

Petrone, et al.; "Reliability Issues in Photovoltaic Power Processing Systems"; IEEE Transactions on Industrial Electronics, IEEE Service Center; USA; vol. 55, No. 7; dated Jul. 31, 2008; pp. 2569-2580.

* cited by examiner

METHOD AND APPARATUS OF DETECTING GRID ISLANDING

CROSS-REFERENCE TO RELATED APPLICATIONS

This is a national stage application which claims priority to International patent application Serial No.: PCT/EP2019/087105, filed on Dec. 27, 2019; and which is herein incorporated by reference in its entirety.

FIELD

Embodiments of the present disclosure generally relate to the field of power converter system, and in particular, to method and apparatus of detecting grid islanding in a power converter system, in particular, a grid supporting voltage source converter system.

BACKGROUND

The grid connected power converters can be mainly classified as grid following, grid supporting and grid forming converters.

The grid-following converters can be represented as an alternating current (AC) current source connected to grid in parallel with high impedance which may be designed to deliver power. These types of converters are suitable to operate in parallel with other grid-following power converters in grid-connected mode. Most Distributed Grid (DG) systems such as photovoltaic (PV) or wind power system operate as grid-following converters. In these converter systems, one of the important requirements is detection of unintentional island (especially high-impedance islanding, gird open-circuit) which energize a portion of the electrical grid. Different passive and active island detection mechanisms are available. The active island detection mechanisms are developed to overcome the shortcomings of passive island detection mechanisms. Based on the requirements of IEEE standards, active islanding detection method is tested to establish its performance when a parallel resistive-inductive-capacitive (RLC) load with specific quality factor (Q) is used (for utility connected PV systems IEEE standard 929-2000 requirements are considered).

The grid-forming converters can be represented as an AC voltage source with a low output impedance controlling the output with given voltage magnitude and frequency. Most of the grid-connected systems (such as PV or wind power system) in grid-connected mode operate as grid following converter system and in standalone mode as grid forming converter system.

The grid supporting converter system is controlled as a voltage source with a series low impedance or as a current source with a parallel high impedance connected to grid. The aim of gird supporting converter systems is to maintain the AC voltage magnitude and frequency by regulating power delivered to the grid. The power delivered by grid supporting converter system controlled as voltage source is a function of the ac grid voltage, voltage of emulated voltage source and the impedance between them.

One of the key requirements of the grid supporting voltage source converter system is to detect upstream unintentional islanding (especially high-impedance islanding, grid open-circuit scenario) to avoid disruption in load voltage due to grid large phase angle discrepancy reconnection with the grid supporting voltage source converter system before disconnection of input switch. To overcome this scenario an active islanding detection for the grid supporting voltage source converter system is required.

SUMMARY

In general, example embodiments of the present disclosure provide method and apparatus of detecting grid islanding in a grid supporting voltage source converter system.

In a first aspect, there is provided a method of detecting grid islanding for a grid supporting voltage source converter. The method includes modulating an output voltage at an output of the grid supporting voltage source converter; determining at least one grid parameter at an input to the grid supporting voltage source converter; and detecting the grid islanding for the grid supporting voltage source converter based on the at least one grid parameter.

In a second aspect, there is a grid supporting voltage source converter system. The grid supporting voltage source converter system includes a grid supporting voltage source converter; and a controller coupled to grid supporting voltage source converter and configured to implement the method of the first aspect.

It is to be understood that the Summary section is not intended to identify key or essential features of embodiments of the present disclosure, nor is it intended to be used to limit the scope of the present disclosure. Other features of the present disclosure will become easily comprehensible through the following description.

BRIEF DESCRIPTION OF THE DRAWINGS

Through the more detailed description of some embodiments of the present disclosure in the accompanying drawings, the above and other objects, features and advantages of the present disclosure will become more apparent, wherein.

Throughout the drawings, the same or similar reference numerals represent the same or similar element.

DETAILED DESCRIPTION

Principle of the present disclosure will now be described with reference to some example embodiments. It is to be understood that these embodiments are described only for the purpose of illustration and help those skilled in the art to understand and implement the present disclosure, without suggesting any limitations as to the scope of the disclosure. The disclosure described herein can be implemented in various manners other than the ones describe below.

As used herein, the term "includes" and its variants are to be read as open terms that mean "includes, but is not limited to." The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Impedance isolated single conversion (ZISC) based uninterruptable power supply (UPS) system in grid-connected mode resembles grid-supporting converter system which operates as a voltage source in both grid-connected mode and standalone mode. One of the key requirements of the ZISC based UPS system in grid-connected mode is to detect upstream unintentional islanding (especially high-impedance islanding, grid open-circuit scenario) to avoid disruption in load voltage due to grid large phase angle discrepancy reconnection with UPS before disconnection of input switch. To overcome this scenario, an active islanding detection for a grid-supporting voltage source converter, especially ZISC based UPS is required.

Figure 1:
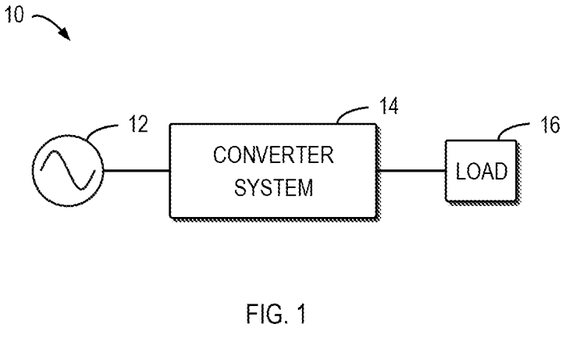
FIG. 1 is a schematic diagram illustrating a power system in accordance with an embodiment of the present disclosure.

FIG. 1 is a schematic diagram illustrating a power system 10 in accordance with an embodiment of the present disclosure. As shown in FIG. 1, a grid 12 is electrically coupled to a grid supporting voltage source converter system 14, which is in turn electrically coupled to the load 16. The grid supporting voltage source converter system 14 is configured to convert the grid 12 to an output voltage to power the load 16.

When upstream unintentional island occurs, the grid supporting voltage source converter system 14 energizes the upstream network which shall be a safety issue for the maintenance or service personal. In order to solve this problem, an active island detection method is proposed for the grid-supporting voltage source converter system 14.

Figure 2:
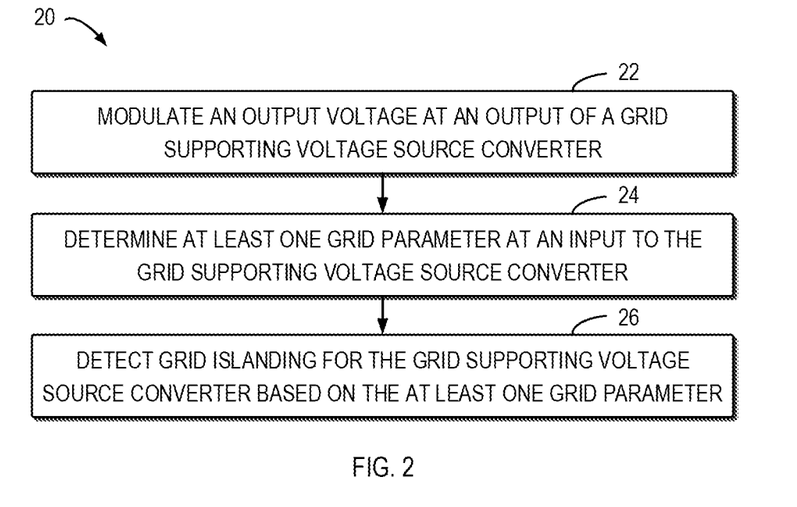
FIG. 2 is a flowchart illustrating a method of grid islanding in a grid supporting voltage source converter system in accordance with an embodiment of the present disclosure.

FIG. 2 is a flowchart illustrating a method 20 of detecting grid islanding in the grid supporting voltage source converter system 14 in accordance with an embodiment of the present disclosure. The method 20 can be implemented in a system controller of the grid supporting voltage source converter system 14. Alternatively, the method 20 can be implemented in another controller for the grid supporting voltage source converter system 14.

At block 22, an output voltage is modulated at an output of the grid supporting voltage source converter 14. For example, the output voltage may be controlled based on a voltage reference by the system controller. In this case, the output voltage can be modulated by modulating the voltage reference, for example, imposing a modulation (for example, amplitude modulation) term to the voltage reference continuously or for a period of time. In other words, the output voltage can be modulated by continuously imposing an amplitude modulation term to the voltage reference for the period of time.

In some embodiments, the grid supporting voltage source converter 14 can include a plurality of grid supporting voltage source converter units coupled in parallel between the input and the output. For example, modulating the output voltage includes synchronously modulating an output voltage of the plurality of grid supporting voltage source converter units at the output of the grid supporting voltage source converter.

In some embodiments, the grid supporting voltage source converter is configured to be operated in a light-load condition to detect the grid islanding event in required time.

At block 24, at least one grid parameter is determined at an input to the grid supporting voltage source converter.

In some embodiments, the block 24 includes measuring an input voltage and an input current at the input to the grid supporting voltage source converter; and determining the at least one grid parameter based on the input voltage and the input current. For example, the at least one grid parameter includes an input impedance at the input to the grid supporting voltage source converter. The input impedance may be determined based on the input voltage and the input current.

At block 26, the grid islanding is detected in the grid supporting voltage source converter based on the at least one grid parameter. For example, if the input impedance exceeds a predetermined value, the grid islanding is detected in the grid supporting voltage source converter.

The present disclosure will now be described with reference to a ZISC based UPS system. ZISC-based UPS system operates mainly in grid-connected mode or island mode, shown in FIGS. 3 and 4, respectively.

Figure 3:
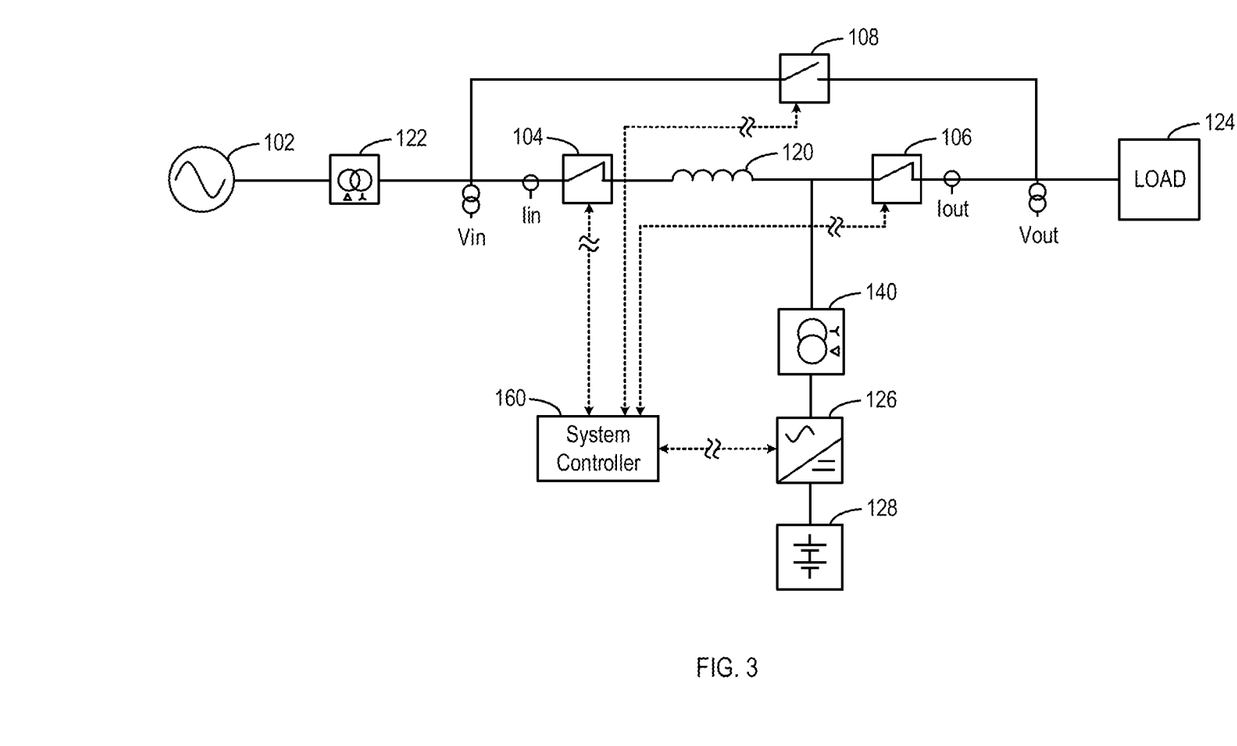
FIG. 3 is a schematic diagram illustrating a grid supporting voltage source converter system operating in a grid-connected mode in accordance with an embodiment of the present disclosure.
Figure 4:
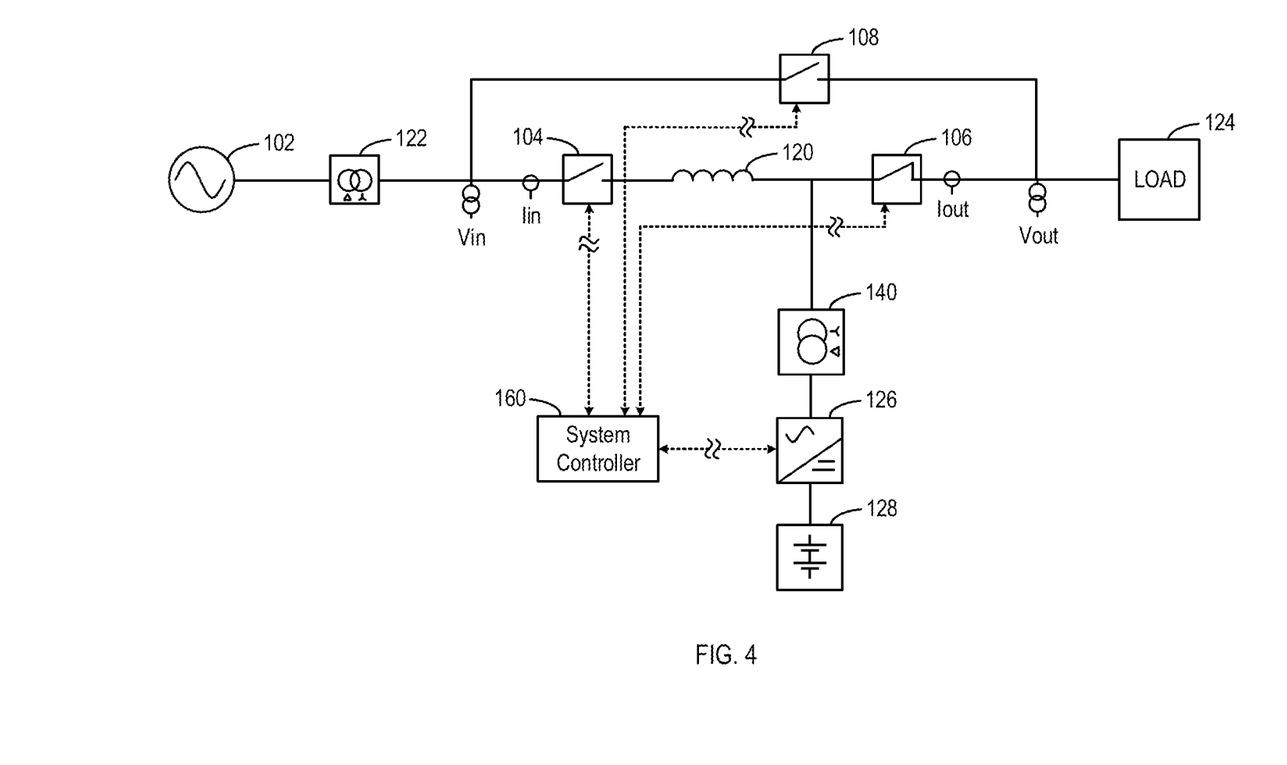
FIG. 4 is a schematic diagram illustrating the grid supporting voltage source converter system of FIG. 3 operating in an island mode.

FIG. 3 is a schematic diagram illustrating the ZISC based UPS system during grid-connected mode and FIG. 4 is a schematic diagram illustrating the grid supporting voltage source converter system of FIG. 3 during island mode. The ZISC based UPS system is electrically coupled to the grid 102 via an optional delta-wye transformer 122. The ZISC based UPS system includes an input coupled to the grid 102 or the delta-wye transformer 122 and an output coupled to the load 124.

As shown in FIG. 3, the ZISC based UPS system includes an input switch 104 electrically coupled to the input to the ZISC based UPS system, an output switch 106 electrically coupled to the output of the ZISC based UPS system, and a bypass switch 108 coupled between the input and output of the ZISC based UPS system.

A series reactor 120 is electrically coupled between the input switch 104 and the output switch 106. A power conversion system 126 is electrically coupled to the node between the series reactor 120 and the output switch 106. The ZISC based UPS system includes energy storage 128 electrically coupled to power conversion system 126. An optional delta-wye transformer 140 is coupled between the power conversion system 126 and the node between the reactor 120 and the output switch 106.

The ZISC based UPS system includes a system controller 160 coupled to the input switch 104, the output switch 106, and the bypass switch 108. The system controller 160 is configured to regulate the power exchange between the UPS and grid by operating the switches 104, 106, and 108.

During grid-connected mode, the UPS system controls the output voltage magnitude and frequency by regulating the power exchange between the UPS and grid. The steady state output voltage is controlled to achieve high fidelity voltage source to the connected load. When upstream unintentional island occurs, the UPS system in grid-connected mode energizes the upstream network which shall be a safety issue for the maintenance or service personal. In this scenario, the UPS output voltage will lead to frequency drift within a short time frame and reclosing of grid before opening the input switch 104 shall distort the output voltage Vout due to grid large phase angle discrepancy.

The occurrence of unintentional grid islanding while UPS in grid-connected mode raises concerns over safety of the maintenance or service personnel, protection of customer load and protection of product itself.

In order to solve this problem, an active island detection method is proposed for grid-supporting voltage source converter system which can be applied to the ZISC-based UPS system. The active island detection method relies on a continuous imposition of a modulation term (for example, amplitude modulation) on the UPS voltage reference being used as a modified reference for the UPS output voltage to be generated.

In some embodiments, one of the key UPS requirements is high fidelity output voltage to the load which highlights the importance of selection of excitation signal frequencies and their magnitudes.

Selection of excitation signal may depend on the application use case. For example, if the grid impedance or the open circuit grid impedance is purely RL and the grid voltage is purely sinusoidal then high frequency excitation, including harmonics that that naturally occurs due to modulation or non-linear UPS load can be used. Unfortunately the loads of many industrial plants are complex and non-linear and do not meet the above criteria.

If the grid has significant capacitance (for example, power factor capacitors), high frequency excitation is ineffective. If the grid voltage has significant "normal" harmonic distortion, odd harmonic excitation is ineffective. Even harmonics could be used but there are strict limits on the allowable levels due to their impact on some loads due to the asymmetry factor. For example, simple rectifiers can create DC, and overload on half phases. Low frequency modulation (side bands of the fundamental) can be very effective even at 1% level. The risk here is that the flicker meter levels are sensitive to frequency from 5 to 15 Hz at extremely low values (as low as 0.4% at 9 Hz).

In some embodiments, the frequency spectrum of the excitation signal may include at least one of a single frequency, multiple frequencies of same magnitude, multiple frequencies of different magnitudes, and random spread of frequencies.

The variation of UPS output voltage due to excitation signal changes the grid voltage which further changes grid current depending on grid source impedance. The UPS input voltage Vin and input current Iin can be measured to estimate at least one grid parameter, for example, an impedance, voltage magnitude and/or phase angle. Too much noise will corrupt the parameter estimation. This includes harmonic signals in the grid voltage—something which are quite likely. To avoid corrupt parameters estimation due to noise, the measured signals are passed through narrow band filters that permit only a small group of signals around the desired excitation signal. If the estimated grid parameters deviates the given threshold limits, then UPS detects grid islanding.

The active island detection method can differentiate detection of upstream high impedance islanding, moderate impedance islanding and low impedance islanding. Any estimation techniques (especially least square estimation and recursive least square estimation) shall be used to estimate the grid parameters (especially impedance, voltage magnitude and phase angle) that are used to detect unintentional island conditions. The estimation techniques are implemented with measured grid voltages and grid currents in three phase quantities or stationary reference frame system or rotating reference frame system. The active island detection method shall be used to detect grid-island for single-phase or poly-phase grid supporting converter systems controlled as voltage source.

When grid islanding is detected, the system controller 160 commands to open the input switch 104. When the input switch 104 is opened, the UPS operates as a grid forming converter system by controlling the output voltage Vout with given voltage magnitude and frequency references.

The active grid detection method influences the UPS output voltage quality which can be further optimized by implementing an upstream power quality event detection co-ordination mechanism. This mechanism enables the proposed method to co-ordinate with other power quality detection methods (for example, this method shall be enabled when system is operating at light-load).

In some embodiments, there may be poor parameter estimation in parallel connected multiple UPS systems, as the other UPS systems lower the apparent impedance of the supply. To avoid this, the parallel connected multiple UPS systems must have synchronized excitation signals. For example, if N parallel UPS systems excitation signals are synchronized and grid island occurs, then the grid impedance estimation is N times as large from the perspective of a single UPS system due to the assistance of other parallel UPS systems. If the excitation signal is not synchronized, then the grid impedance estimation is 1/N of the series reactor impedance. The parallel connected multiple unit systems in gird-connected mode are shown in FIGS. 5-6.

Figure 5:
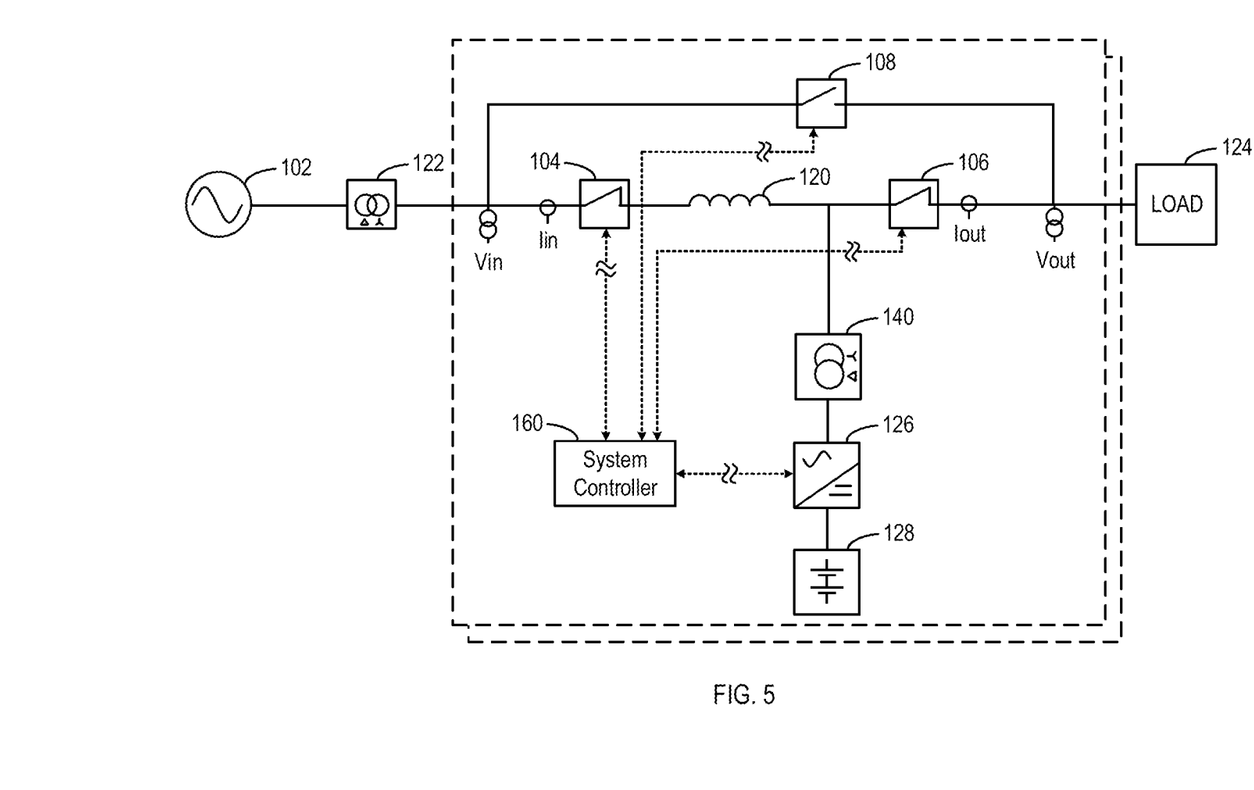
FIG. 5 is a schematic diagram illustrating a grid supporting voltage source converter system in accordance with another embodiment of the present disclosure.

FIG. 5 is a schematic diagram illustrating a ZISC based UPS system in accordance with another embodiment of the present disclosure. As shown in FIG. 5, the grid supporting voltage source converter system includes multiple units, in which each unit can be implemented by the converter as shown in FIGS. 3 and 4.

Figure 6:
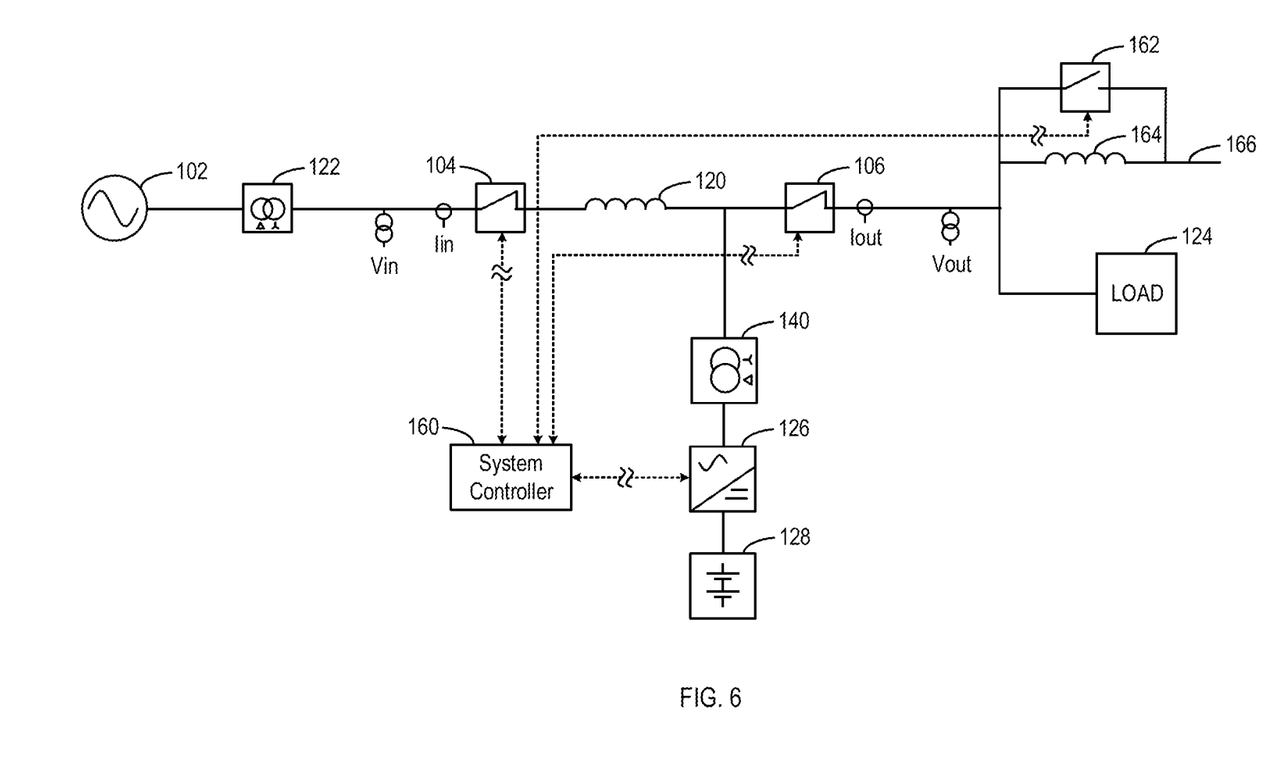
FIG. 6 is a schematic diagram illustrating a grid supporting voltage source converter system in accordance with a further embodiment of the present disclosure.

FIG. 6 is a schematic diagram illustrating a ZISC based UPS system in accordance with a further embodiment of the present disclosure. As shown in FIG. 6, the grid supporting voltage source converter system includes: an input switch 104 coupled to the input of the grid supporting voltage source converter; an output switch 106 coupled to the output of the grid supporting voltage source converter system; a ring-bus reactor 164 coupled to the output of the grid supporting voltage source converter system; a bypass switch 162 coupled across the ring-bus reactor; a series reactor 120 coupled between the input switch 104 and the output switch 106; a power conversion system 126 coupled to the series reactor 120; and energy storage 128 coupled to the power conversion system 126.

It is noted that FIG. 6 shows one of the plurality of units in the ZISC based UPS system. Each unit is coupled across the input and the bus ring 166 to form a parallel connected multiple unit system.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

By way of example, embodiments of the present disclosure can be described in the general context of machine-executable instructions, such as those included in program modules, being executed in a device on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

In the context of this disclosure, a machine readable medium may be any tangible medium that may contain, or store a program for use by or in connection with an instruction execution system, apparatus, or device. The machine readable medium may be a machine readable signal medium or a machine readable storage medium. A machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

We claim:

1. A method of detecting grid islanding in a grid supporting voltage source converter, the method comprising:
    modulating an output voltage at an output of the grid supporting voltage source converter to power a load, wherein variation in the output voltage due to an excitation signal changes a grid voltage and a grid current depending on a grid source impedance;
    determining at least one grid parameter based on measuring an input voltage and an input current from a grid at an input to the grid supporting voltage source converter; and
    detecting the grid islanding for the grid supporting voltage source converter based on the at least one grid parameter exceeding a threshold.

2. The method of claim 1, wherein modulating the output voltage comprises:
    modulating a voltage reference for use in a controller of the grid supporting voltage source converter.

3. The method of claim 2, wherein modulating the voltage reference comprises:
    imposing an amplitude modulation term to the voltage reference continuously or for a period of time.

4. The method of claim 1, wherein determining the at least one grid parameter comprises:
    measuring the input voltage and the input current at the input to the grid supporting voltage source converter.

5. The method of claim 1, wherein determining the at least one grid parameter based on measuring the input voltage and the input current further comprises:
    determining an input impedance at the input to the grid supporting voltage source converter based on the input voltage and the input current.

6. The method of claim 1, wherein the grid supporting voltage source converter comprises a plurality of grid supporting voltage source converter units coupled in parallel, and wherein modulating the output voltage comprises synchronously modulating an output voltage of the plurality of grid supporting voltage source converter units at the output of the grid supporting voltage source converter.

7. The method of claim 1, wherein modulating the output voltage comprises:
    operating the grid supporting voltage source converter in light-load condition.

8. A grid supporting voltage source converter system comprising:
    a grid supporting voltage source converter; and
    a controller coupled to the grid supporting voltage source converter and configured to implement the method of claim 1.

9. The grid supporting voltage source converter system of claim 8, wherein the grid supporting voltage source converter comprises:
    an input switch coupled to the input of the grid supporting voltage source converter;
    an output switch coupled to the output of the grid supporting voltage source converter;
    a series reactor coupled between the input switch and the output switch;
    a power conversion system coupled to a node between the series reactor and the output switch; and
    energy storage coupled to the power conversion system.

10. The grid supporting voltage source converter system of claim 8, wherein the grid supporting voltage source converter further comprises at least one of:
    a bypass switch coupled between the input and output of the grid supporting voltage source converter; or
    a ring-bus reactor coupled between the output of the grid supporting voltage source converter and a ring bus, and the bypass switch coupled across the ring-bus reactor.

11. A grid supporting voltage source converter system comprising:
    a grid supporting voltage source converter; and a controller coupled to the grid supporting voltage source converter and configured to implement the method of claim 2.

12. A grid supporting voltage source converter system comprising:
a grid supporting voltage source converter; and
a controller coupled to the grid supporting voltage source converter and configured to implement the method of claim 3.

13. A grid supporting voltage source converter system comprising:
a grid supporting voltage source converter; and
a controller coupled to the grid supporting voltage source converter and configured to implement the method of claim 4.

14. A grid supporting voltage source converter system comprising:
a grid supporting voltage source converter; and
a controller coupled to the grid supporting voltage source converter and configured to implement the method of claim 5.

15. A grid supporting voltage source converter system comprising:
a grid supporting voltage source converter; and
a controller coupled to the grid supporting voltage source converter and configured to implement the method of claim 6.

16. A grid supporting voltage source converter comprising:
an input switch coupled to an input of the grid supporting voltage source converter;
an output switch coupled to an output of the grid supporting voltage source converter;
a series reactor coupled between the input switch and the output switch;
a power conversion system coupled to the series reactor and the output switch;
an energy storage coupled to the power conversion system; and
a controller communicatively coupled to the input switch, the output switch, and the power conversion system and configured to perform operations comprising:
modulate an output voltage at the output of the grid supporting voltage source converter to power a load, wherein variation in the output voltage due to an excitation signal changes a grid voltage and a grid current depending on a grid source impedance;
determine at least one grid parameter based on measuring an input voltage and an input current from a grid at the input to the grid supporting voltage source converter; and
detect grid islanding for the grid supporting voltage source converter based on the at least one grid parameter exceeding a threshold.

17. The grid supporting voltage source converter of claim 16, wherein the grid supporting voltage source converter further comprises at least one of:
a bypass switch coupled between the input and the output of the grid supporting voltage source converter; or
a ring-bus reactor coupled between the output of the grid supporting voltage source converter and a ring bus, and the bypass switch coupled across the ring-bus reactor.

18. The grid supporting voltage source converter of claim 16, wherein the grid supporting voltage source converter comprises a plurality of grid supporting voltage source converter units coupled in parallel, and wherein the controller is further configured to synchronously modulate the output voltage of each of the plurality of grid supporting voltage source converter units.

19. The grid supporting voltage source converter of claim 16, wherein the grid supporting voltage source converter is configured to operate in light-load condition.

20. The grid supporting voltage source converter of claim 16, wherein the controller is further configured to impose an amplitude modulation term to a voltage reference for the output voltage continuously or for a period of time.

* * * * *